(12) United States Patent
Schlösser et al.

(10) Patent No.: US 6,504,200 B2
(45) Date of Patent: Jan. 7, 2003

(54) DRAM CELL CONFIGURATION AND FABRICATION METHOD

(75) Inventors: Till Schlösser, Dresden (DE); Bernhard Sell, Dresden (DE); Josef Willer, Riemerling (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/951,243

(22) Filed: Sep. 12, 2001

(65) Prior Publication Data

US 2002/0079527 A1 Jun. 27, 2002

Related U.S. Application Data (63) Continuation of application No. PCT/DE00/00756, filed on Mar. 10, 2000.

(30) Foreign Application Priority Data

Mar. 12, 1999 (DE) .......................................... 199 11 148

(51) Int. Cl.[7] .............................................. H01L 27/108
(52) U.S. Cl. ........................ 257/301; 257/302; 257/296; 257/306; 257/303; 257/311; 257/300; 438/270; 438/268; 438/259; 438/243; 438/249; 438/241; 365/145; 365/182; 365/207
(58) Field of Search ................................ 257/296, 306, 257/303, 312, 301, 302, 905, 906, 330, 305, 311, 329, 298, 300, 347, 350, 352, 353, 333, 334; 438/270, 268, 239, 243, 249, 241; 365/149, 182, 207

(56) References Cited

U.S. PATENT DOCUMENTS

| | | | | |
|---|---|---|---|---|
| 4,824,793 A | * | 4/1989 | Richardson et al. | 437/47 |
| 5,208,657 A | * | 5/1993 | Chatterjee et al. | 257/302 |
| 5,225,697 A | * | 7/1993 | Malhi et al. | 257/302 |
| 5,376,575 A | * | 12/1994 | Kim et al. | 437/52 |
| 5,497,017 A | | 3/1996 | Gonzales | |
| 5,504,357 A | * | 4/1996 | Kim et al. | 257/306 |
| 5,578,850 A | * | 11/1996 | Fitch et al. | 257/329 |
| 5,736,761 A | | 4/1998 | Risch et al. | |
| 5,828,094 A | | 10/1998 | Lee | |
| 5,854,500 A | * | 12/1998 | Krautschneider | 257/300 |
| 5,892,707 A | * | 4/1999 | Noble | 365/149 |
| 5,937,296 A | * | 8/1999 | Arnold | 438/270 |
| 6,044,009 A | * | 3/2000 | Goebel et al. | 365/149 |
| 6,150,210 A | * | 11/2000 | Arnold | 438/243 |
| 6,229,169 B1 | * | 5/2001 | Hofmann et al. | 257/296 |
| 6,352,894 B1 | * | 3/2002 | Goebel et al. | 438/253 |

FOREIGN PATENT DOCUMENTS

| | | |
|---|---|---|
| EP | 0 899 790 A2 | 3/1999 |
| JP | 02159058 | 6/1990 |

* cited by examiner

Primary Examiner—Nathan J. Flynn
Assistant Examiner—Fazli Erdem
(74) Attorney, Agent, or Firm—Laurence A. Greenberg; Werner H. Stemer; Gregory L. Mayback (57) ABSTRACT

Bit lines are arranged in the lower parts of trenches of a substrate. Word lines are located above the substrate except for protuberances or bulges, which extend downwards into the trenches and which are arranged above the bit lines. The transistors are vertical transistors whose source/drain regions are located below the word lines and between adjacent trenches. The capacitors are linked with the upper source/drain regions. Conductive structures that surround the word lines from the top and the sides while being insulated from the word lines and bordering on the upper source/drain regions can link the upper source/drain regions with the capacitors.

12 Claims, 6 Drawing Sheets

DRAM CELL CONFIGURATION AND FABRICATION METHOD

CROSS-REFERENCE TO RELATED APPLICATION

This application is a continuation of copending International Application No. PCT/DE00/00756, filed Mar. 10, 2000, which designated the United States.

BACKGROUND OF THE INVENTION

Field of the Invention

The invention relates to a DRAM cell configuration, i.e. a dynamic random access memory cell configuration, in which bit lines are buried in a substrate, and to a method of fabricating the DRAM cell configuration.

At present, DRAM cell configurations are formed with memory cells that are almost exclusively so-called one-transistor memory cells. Those cells each comprise one transistor and one capacitor. The information of the memory cell is stored in the form of a charge on the capacitor. The capacitor is connected to the transistor, with the result that when the transistor is driven via a word line, the charge of the capacitor can be read out via a bit line.

It is generally endeavored to produce a DRAM cell configuration with high packing density.

U.S. Pat. No. 5,497,017 describes a DRAM cell configuration comprising one-transistor memory cells. A space requirement per memory cell may be $4F^2$, where F is the minimum feature size that can be fabricated in the technology used. In order to produce bit lines, trenches running parallel to one another are etched in a silicon substrate. A thin insulating layer is deposited which does not fill the trenches. In order to produce the bit lines, the trenches are filled with tungsten. The insulating layer is in each case removed from a side wall of each trench, with the result that the bit lines are partly uncovered laterally. Source/drain regions and channel regions of vertical transistors are produced by epitaxy. In this case, lower source/drain regions of the transistors laterally adjoin the bit lines. Word lines run transversely with respect to the bit lines and in trenches, which are arranged between mutually adjacent transistors.

SUMMARY OF THE INVENTION

It is accordingly an object of the invention to provide a DRAM cell configuration whose memory cells each have a transistor and a capacitor, which overcomes the above-mentioned disadvantages of the heretofore-known devices and methods of this general type and the bit lines of which are buried in the substrate and which can be fabricated with a space requirement per memory cell of $4F^2$ and, at the same time, with lower process complexity by comparison with the prior art. Furthermore, it is an object of the invention to provide a fabrication method for producing the novel DRAM cell configuration.

With the foregoing and other objects in view there is provided, in accordance with the invention, a DRAM cell configuration, comprising:

a plurality of memory cells each having a vertical transistor and a capacitor;

a substrate formed with substantially parallel trenches each having side walls and having a bit line arranged therein in a lower part thereof;

an insulation formed in the lower part of a respective said trench between said bit line and said substrate, except for a strip-type cut-out formed parallel to said trench and in said first sidewall of said trench;

a further insulation formed on parts of said side walls of said trench above the lower part of said trench and an upper area of said bit line;

word lines extending transversely with respect to said bit line, said word lines, except for downwardly directed protuberances that reach into said trenches and that are arranged above said bit lines, running above said substrate, and an insulating layer isolating said word lines from said substrate;

said protuberances of said word lines and insulating structures being arranged alternately above said bit line in said trench;

said transistors having upper source/drain regions and lower source/drain regions arranged between said trenches and under said word lines;

further insulating structures formed in said substrate for insulating from one another upper source/drain regions of mutually adjacent transistors along said trench; and wherein said upper source/drain regions of said transistors are connected to said capacitors of said memory cells.

In other words, the problems underlying the invention are solved by means of a DRAM cell configuration having memory cells which each have a transistor and a capacitor, in which a substrate has trenches which essentially run parallel to one another and in each of which a bit line is arranged. The bit line is arranged in a lower part of the associated trench. The lower part of the trench, except for a strip-type cut-out which runs parallel to the trench and is arranged on a first side wall of the trench, is provided with an insulation, which is arranged between the bit line and the substrate. Parts of the side walls of the trench which are arranged above the lower part of the trench and an upper area of the bit line are provided with a further insulation. Word lines run transversely with respect to the bit line. The word lines, except for downwardly directed protuberances, which reach into the trenches and are arranged above the bit lines, run above the substrate. Insulating structures and the protuberances of the word lines are arranged alternately in the trench above the bit lines. The transistors of the memory cells are configured as vertical transistors. Upper source/drain regions and lower source/drain regions of the transistors are arranged between the trenches. Further insulating structures are arranged in the substrate, which structures isolate from one another upper source/drain regions of mutually adjacent transistors along the trench. The upper source/drain regions of the transistors are connected to the capacitors of the memory cells.

The protuberances of the word lines act as gate electrodes of the transistors.

With the above and other objects in view there is also provided, in accordance with the invention, a method of fabricating a DRAM cell configuration. The method comprises the following method steps:

producing an insulating layer on a substrate;

forming substantially parallel trenches in the substrate;

providing an insulation for lower parts of the trenches, except for strip-type cut-outs running parallel to the trenches and arranged on first side walls of the trenches;

producing a bit line in each trench in a lower part thereof;

providing a further insulation for parts of the side walls of the trenches arranged above the lower parts of the trenches and for the bit lines;

filling the trenches with a conductive material;

covering the conductive material with a protective layer;

patterning the conductive material and the protective layer to produce word lines covered by the protective layer and running transversely with respect to the bit lines and having downwardly directed protuberances reaching into the trenches;

depositing insulating material and etching the insulating material back together with the insulating layer selectively with respect to the protective layer and with respect to the substrate, until the substrate is uncovered, such that insulating structures are produced in the trenches, between the protuberances of the word lines and above the bit lines;

etching the substrate selectively with respect to the insulating structures to produce depressions between the word lines and between the trenches;

producing upper source/drain regions of transistors of memory cells between the trenches and between the depressions in the substrate;

producing lower source/drain regions of the transistors each adjoining one of the cut-outs, in the substrate under the upper source/drain regions;

producing further insulating structures in the depressions; and producing capacitors of the memory cells and connecting each of the capacitors to one of the upper source/drain regions.

In other words, the problems underlying the invention are furthermore solved by means of a method for fabricating a DRAM cell configuration having memory cells which each have a transistor and a capacitor, in which an insulating layer is produced on a substrate. Trenches, which essentially run parallel to one another are produced in the substrate. Lower parts of the trenches, except for strip-type cut-outs which run parallel to the trenches and are arranged on first side walls of the trenches, are provided with an insulation. A bit line is in each case produced in the lower parts of the trenches. Parts of the side walls of the trenches which are arranged above the lower parts of the trenches and the bit lines are provided with a further insulation. Conductive material is applied, the trenches thereby being filled. A protective layer is produced, which covers the conductive material. The conductive material and the protective layer are patterned in such a way that word lines covered by the protective layer are produced, which word lines run transversely with respect to the bit lines and have downwardly directed protuberances which reach into the trenches. Insulating material is deposited and etched back together with the insulating layer selectively with respect to the protective layer and with respect to the substrate, until the substrate is uncovered, with the result that insulating structures are produced in the trenches, which structures are arranged between the protuberances of the word lines and above the bit lines. The substrate is etched selectively with respect to the insulating structures, with the result that depressions are produced between the word lines and between the trenches. Upper source/drain regions of transistors of memory cells are produced between the trenches and between the depressions in the substrate. Lower source/drain regions of the transistors, which in each case adjoin one of the cut-outs, are produced in the substrate under the upper source/drain regions. Further insulating structures are produced in the depressions. Capacitors of the memory cells are produced, which are in each case connected to one of the upper source/drain regions. On the first side walls of the trenches, the word lines act as gate electrodes of the transistors and the further insulation acts as a gate dielectric.

No epitaxy is required for producing the source/drain regions of the transistors. This means that the process is simplified.

The upper source/drain regions, the lower source/drain regions, the insulating structures and the further insulating structures are produced in a self-aligned manner with respect to the word lines and with respect to the trenches, with the result that the DRAM cell configuration can have a high packing density, i.e. a small space requirement per memory cell. If the trenches are produced with a strip-type mask whose strips run parallel to one another and the word lines are patterned with the aid of a further strip-type mask whose strips run parallel to one another and transversely with respect to the trenches, and if the strips have a width of F and a spacing of F from one another, then the space requirement of a memory cell can be $4F^2$, where F is the minimum feature size that can be fabricated in the technology used.

In order to avoid floating body effects, it is advantageous if the lower source/drain region of a transistor is arranged between the trench and an adjacent trench and is spaced apart from the adjacent trench. In this case, a channel region of the transistor, which is arranged between the lower source/drain region and the upper source/drain region, is electrically connected to the largest part of the substrate.

In order to produce such a lower source/drain region, at least a part of the bit line which adjoins the cut-out may be composed of doped polysilicon. During a heat treatment step, dopant diffuses from the bit line into the substrate, where it forms a doped region which is arranged between the trench and the adjacent trench, adjoins the cut-out and is spaced apart from the adjacent trench. This heat treatment step may be, for example, a thermal oxidation for producing a gate dielectric.

Parts of the doped region, which are arranged under the upper source/drain regions act as the lower source/drain regions.

The doped region can be patterned by the depressions, with the result that the lower source/drain regions of mutually adjacent transistors along the trench, which are isolated from one another, are produced from the doped region. In this case, the lower source/drain regions of the mutually adjacent transistors along the trench and the further insulating structures alternately adjoin the bit line in the region of the cut-out.

As an alternative, the lower source/drain region is produced by patterning a lower doped layer of the substrate. The patterning is effected by the production of the trenches. In order to isolate from one another lower source/drain regions of the mutually adjacent transistors along the trench, it is possible, in this case, too, for the depressions to be produced in such a way that they reach more deeply than the cut-outs of the insulation.

The upper source/drain region can be produced by patterning an upper doped layer of the substrate. The patterning is effected by the production of the depressions and of the trenches. The depressions are thus at least deep enough that they cut through the upper doped layer.

The upper source/drain region can also be produced by implantation. By way of example, the implantation is effected after the production of the trenches. The upper source/drain regions of transistors, which are adjacent to one another along the bit line are isolated from one another by the production of the depressions.

The connection of the capacitor to the upper source/drain region can be effected via a conductive structure. To that end, the upper source/drain region of the transistor is covered with an insulating layer. The word line runs above the insulating layer. A projection of the upper source/drain region onto the insulating layer overlaps a projection of the word line onto the insulating layer in such a way that it is extended beyond two sides of the projection of the word line, with the result that projections of two parts of the upper source/drain region adjoin the projection of the word line and do not overlap the projection of the word line. Consequently, transversely with respect to the word line, the upper source/drain region has a larger dimension than the word line. Side walls of the word line are provided with insulating spacers. An upper surface of the word line, which surface is remote from the upper source/drain region, is provided with an insulating protective layer. A conductive structure covers the protective layer and the spacers and overlaps the two parts of the upper source/drain region. The capacitor is arranged on the conductive structure.

The conductive structure can be produced in a self-aligned manner with respect to the word line and does not increase the space requirement of the memory cell. By way of example, the spacers are produced before the production of the depressions by depositing and etching back insulating material. After the production of the insulating structures, conductive material is deposited to a thickness such that interspaces between the word lines are not filled. A mask is produced, which covers horizontal surfaces of parts of the conductive material, which are arranged above the word line. The conductive material and the substrate are etched selectively with respect to the mask. Parts of the conductive material, which are arranged between the word lines are consequently removed. In the process, the conductive structures are produced from the conductive material, and the depressions are produced in the substrate.

The mask can be produced in a self-aligned manner, with the result that the space requirement of the memory cell is not increased.

One possibility for producing the mask consists in depositing insulating material non-conformally, with the result that the insulating material is thickest above the horizontal surfaces of those parts of the conductive material, which are arranged above the word line. The mask is produced from the insulating material by etching back the insulating material until parts of the conductive material, which are arranged between the word lines are uncovered. In this case, the mask covers not only the horizontal surfaces of those parts of the conductive material which are arranged above the word line, but also areas of the conductive material which run transversely with respect thereto.

A further possibility for producing the mask consists first of all in depositing the conductive material, which contains doped polysilicon, and then depositing an auxiliary material and etching it back until lateral areas of the conductive material are partly uncovered. Afterward, a thermal oxidation is carried out, thereby producing the mask on uncovered parts of the conductive material. The auxiliary material is subsequently removed.

In order to increase the electrical conductivity of the bit line, the latter may be partly composed of metal. In addition to molybdenum or tantalum, tungsten is partly suitable if the substrate is composed of silicon, since silicon and tungsten have approximately the same thermal expansion coefficients, thereby avoiding mechanical strain and defects resulting therefrom in the event of temperature changes.

In order to prevent the situation where a metal silicide, which has a lower electrical conductivity, is formed, on account of diffusion, from the metal of the bit line and the silicon of the substrate or, if provided, the polysilicon of the bit line, it is advantageous to provide a diffusion barrier between the metal and the silicon or the polysilicon. By way of example, a lower part of the bit line is composed of metal. Arranged above it there is a diffusion barrier containing nitrogen. The polysilicon which adjoins the cut-out is arranged on the diffusion barrier.

In order to avoid leakage currents on account of high electric fields at edges of the word lines, it is advantageous to carry out a thermal oxidation after the production of the word lines, with the result that those parts of the further insulations, which are covered by the word lines are thickened at the edges of the word lines.

In order to increase the electrical conductivity of the word lines, the word lines may comprise two parts. A lower part of the word lines, which comprises the protuberances, is preferably composed of doped polysilicon. The second parts of the word lines, which are arranged above the first parts, may be composed e.g. of a metal silicide, such as tungsten silicide. The word lines may also comprise doped polysilicon, an e.g. nitrogen-containing diffusion barrier arranged above the latter, and metal, e.g. tungsten, arranged above the latter.

The insulating layer, the insulation, the further insulation, the insulating structures, the further insulating structures and the mask are composed, for example, of $SiO_2$ or of silicon nitride. However, other insulating materials also lie within the scope of the invention.

The same applies to the protective layer and the spacers. If the insulating layer is composed of $SiO_2$, for example, then the protective layer is preferably composed of silicon nitride in order to enable selective etching.

Instead of silicon, the substrate may be composed of another material, which is suitable for transistors. By way of example, the substrate may contain GaAs.

Other features which are considered as characteristic for the invention are set forth in the appended claims.

Although the invention is illustrated and described herein as embodied in a DRAM cell configuration and a corresponding fabrication method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

It will be understood by those of skill in the art that the figures are not true to scale.

DESCRIPTION OF THE PREFERRED EMBODIMENTS

In the exemplary embodiment described herein, the substrate is made of monocrystalline silicon.

Figure 1:
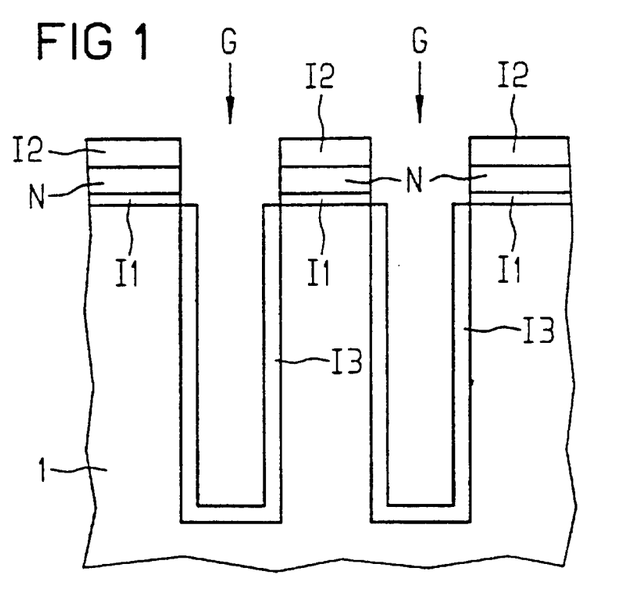
FIG. 1 is a cross-section taken through a substrate after the production of a first insulating layer, a layer made of silicon nitride, a second insulating layer, trenches and an insulation.

Referring now to the figures of the drawing in detail and first, particularly, to FIG. 1 thereof, there is shown a substrate 1, onto a surface of which there is deposited $SiO_2$ to a thickness of approximately 20 nm. This produces a first insulating layer I1. In order to produce a layer made of silicon nitride N, silicon nitride is deposited to a thickness of approximately 50 nm. In order to produce a second insulating layer I2, $SIO_2$ is deposited to a thickness of approximately 200 nm.

With the aid of a strip-type first photoresist mask, whose strips have a width of approximately 100 nm and have a spacing of approximately 100 nm from one another, the second insulating layer I2, the layer made of silicon nitride N and the first insulating layer I1 are patterned, with the result that the substrate 1 is partly uncovered. Afterward, the first photoresist mask is removed. Using HBr, for example, the substrate 1 is etched to a depth of approximately 500 nm. This produced trenches G, as illustrated in FIG. 1. The patterned second insulating layer I2 thereby acts as a mask.

In order to produce an insulation I3 having a thickness of approximately 10 nm, a thermal oxidation is carried out. The insulation I3 covers side walls and bottom walls of the trenches G.

Afterward, in-situ-doped polysilicon is deposited to a thickness of approximately 50 nm. Chemical mechanical polishing is carried out until the second insulating layer I2 is removed. Afterward, the polysilicon is etched back to a depth of approximately 400 nm.

Figure 2:
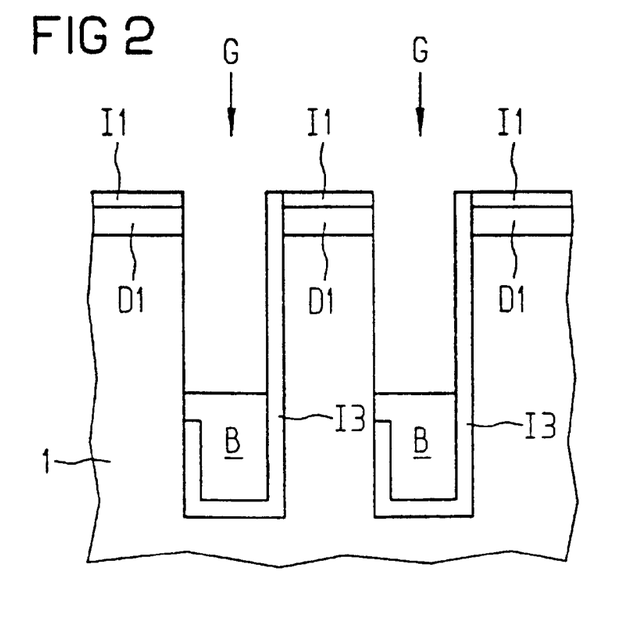
FIG. 2 is a cross-section similar to FIG. 1, after the production of bit lines and first doped regions.

With the aid of a non-illustrated strip-type second photoresist mask, whose strips do not cover first side walls of the trenches G, uncovered parts of the insulation I3 are removed (see FIG. 2). An example of a suitable etchant is HF. The layer made of silicon nitride N protects parts of the first insulating layer I1.

Afterward, further in-situ-doped polysilicon is deposited to a thickness of approximately 50 nm and ground back by chemical mechanical polishing until the layer made of silicon nitride N is uncovered.

By means of implantation with n-doping ions, strip-type first doped regions D1 are produced in the substrate 1, which regions are arranged between the trenches G and adjoin the surface of the substrate 1 (see FIG. 2). The first doped regions D1 have a thickness of approximately 20 nm.

Afterward, the polysilicon is etched back to a depth of approximately 330 nm. The doped polysilicon in the trenches G forms bit lines, which are arranged in lower parts of the trenches G. In the lower parts of the trenches G, the insulation I3 in each case has a strip-type cut-out on the first side wall, where the bit line B adjoins the substrate 1 (see FIG. 2).

In order to remove etching residues, a thermal oxidation is carried out, and the $SiO_2$ thereby produced is subsequently removed by wet etching. The layer made of silicon nitride N is removed.

Figure 3A:
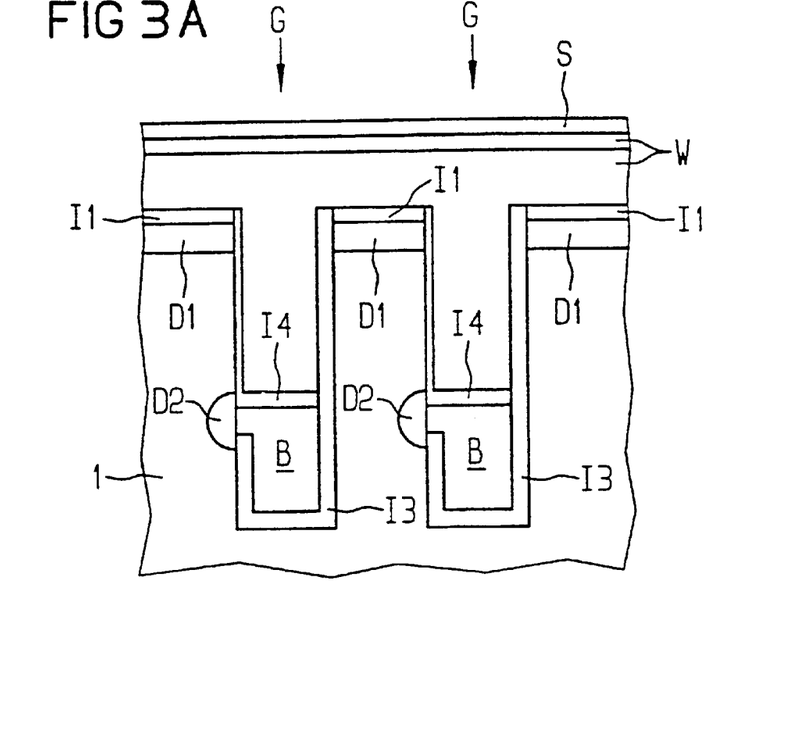
FIG. 3A is a cross-section similar to FIG. 2, after the production of a further insulation, second doped regions, word lines, a protective layer and spacers.
Figure 3B:
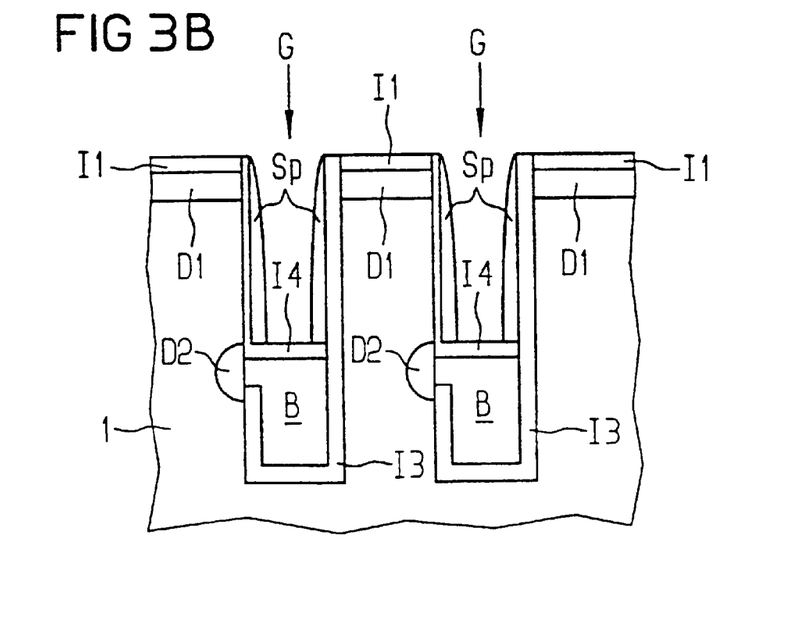
FIG. 3B is a cross-section—parallel to the cross-section of FIG. 3A—through the substrate after the process steps from FIG. 3A.
Figure 3C:
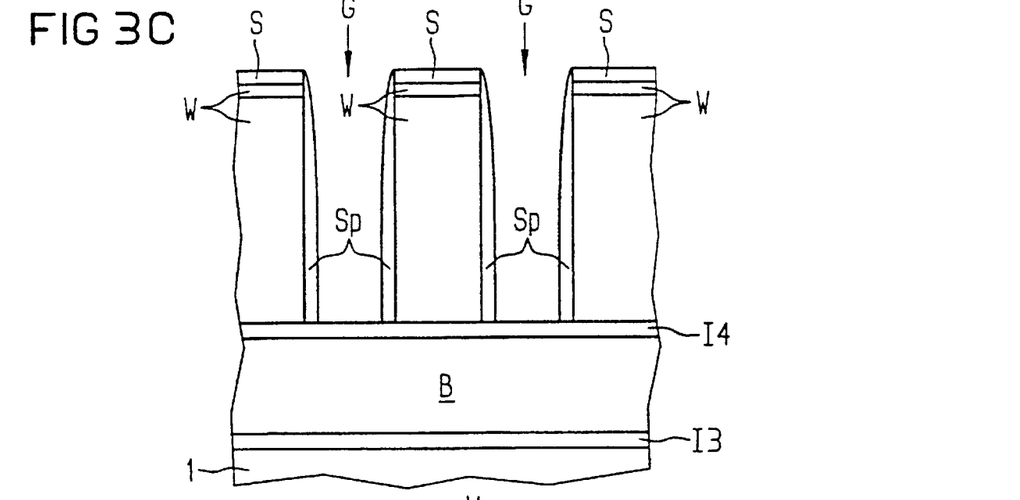
FIG. 3C is a cross-section—perpendicular to the cross-section of FIG. 3A—through the substrate after the process steps from FIG. 3A.
Figures 3D, 3E:
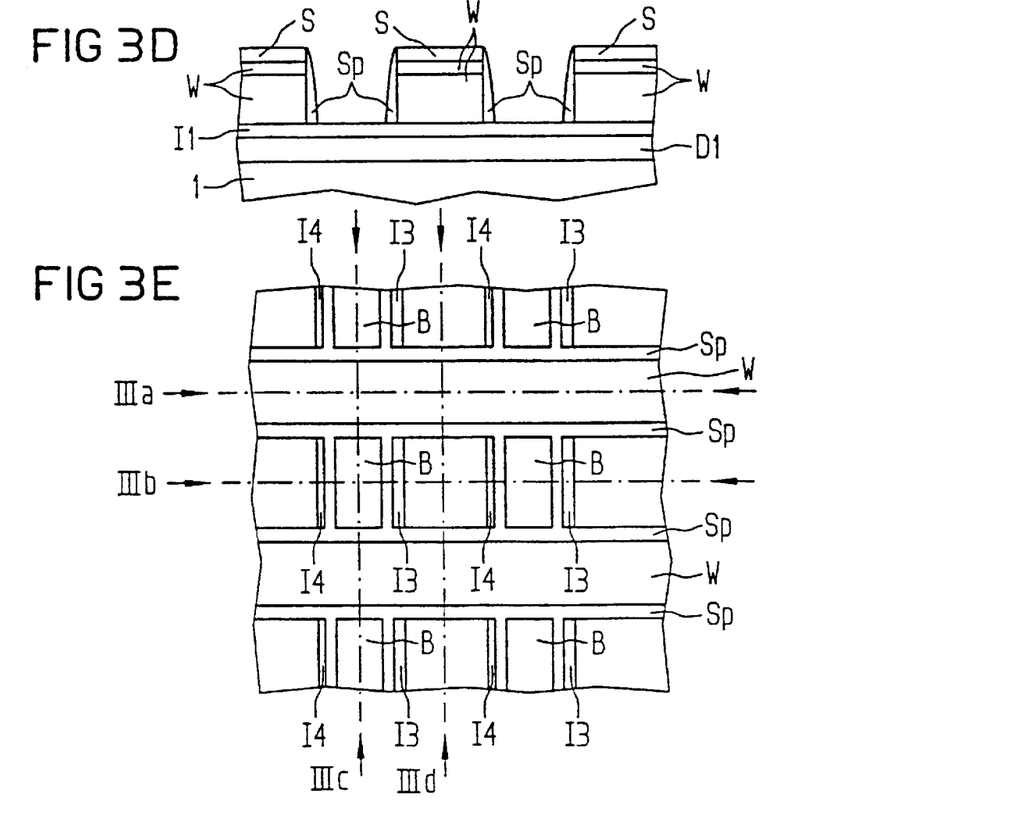
FIG. 3D is a cross-section—parallel to the cross-section of FIG. 3C—through the substrate after the process steps from FIG. 3A.
FIG. 3E is a plan view of the substrate illustrating the first insulating layer, the bit lines, the insulation, the further insulation, the word lines and the spacers.

In order to produce a further insulation I4, a thermal oxidation is carried out. The further insulation I4 has a thickness of approximately 5 nm and covers parts of the side walls of the trenches G arranged above the lower parts of the trenches G and upper areas of the bit lines B (see FIGS. 3A to 3E). The thermal oxidation acts as a heat treatment step through which dopant diffuses from the bit line B into the substrate 1, where it forms second doped regions D2 (see FIGS. 3A, 3B). Each of the second doped regions D2 adjoins that trench G in which is arranged that bit line from which the dopant with which the second doped region D2 was produced diffused. The second doped region D2 is arranged between this trench and an adjacent trench, adjoins the cut-out of the trench G and is spaced apart from the adjacent trench.

Afterward, in-situ-doped polysilicon is deposited to a thickness of approximately 50 nm, the trenches G thereby being filled. Tungsten silicide is deposited over that to a thickness of approximately 80 nm. In order to produce a protective layer S, silicon nitride is deposited to a thickness of approximately 50 nm (see FIGS. 3A to 3D).

With the aid of a non-illustrated strip-type third photoresist mask, whose strips run transversely with respect to the strips of the first photoresist mask, have a width of approximately 100 nm, and have a spacing of approximately 100 nm from one another, silicon nitride, tungsten silicide and polysilicon are etched until parts of the further insulation I4 which are arranged on the bit lines B are uncovered. Word lines W running transversely with respect to the bit lines B are thereby produced from the polysilicon and the tungsten silicide, said word lines having downwardly directed protuberances which reach into the trenches G (see FIGS. 3A to 3E).

The third photoresist mask is removed. In order to reduce leakage currents, a thermal oxidation is carried out, with the result that the further insulation I4 is thickened in sections to a point under the word lines W. Thus, the further insulation I4 is thickened in the region of edges of the word lines W. This thermal oxidation corresponds to the so-called reoxidation step in the case of planar transistors.

In order to produce insulating spacers Sp, silicon nitride is deposited to a thickness of approximately 10 nm and etched back (see FIGS. 3A to 3E). The spacers Sp cover side walls of the word lines W and also parts of the insulation I3 and of the further insulation I4.

Afterward, $SiO_2$ is deposited to a thickness of approximately 50 nm and subjected to chemical mechanical polishing until the protective layer S is uncovered. Afterward, the $SiO_2$ is etched back until the substrate 1 is uncovered. Insulating structures I5 are thereby produced in the trenches, with the result that the protuberances of the word lines W and the insulating structures I5 are alternately arranged in each trench G above the associated bit line B (see FIGS. 4A to 4D).

Afterward, in-situ-doped polysilicon is deposited to a thickness of approximately 10 nm. The thickness is small enough that interspaces between the word lines W are not filled.

With the aid of a strip-type fourth photoresist mask (not illustrated), which corresponds to the first photoresist mask, polysilicon is removed above the trenches G. The fourth photoresist mask is removed. In order to produce a mask M, $SiO_2$ is deposited at a high rate in a CVD method, with the result that the $SiO_2$ grows approximately twice as thick, namely approximately 20 nm, on/above the horizontal surfaces of the parts of the polysilicon which are arranged above the word lines W, compared with locations lying further below.

Afterward, the $SiO_2$ is etched to a depth of approximately 10 nm, with the result that parts of the polysilicon, which are arranged between the word lines W are uncovered. The mask M is thereby produced from the $SiO_2$ (see FIGS. 4A to 4D).

Figure 4A:
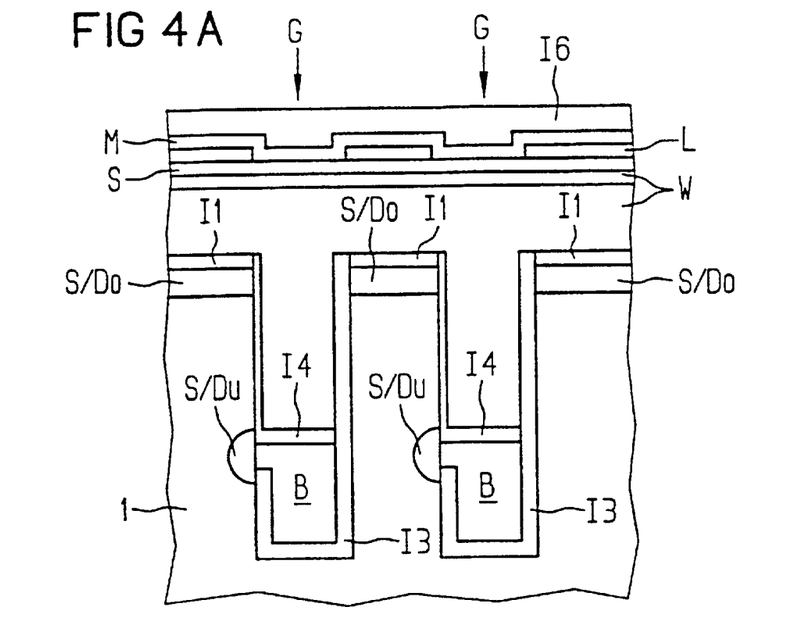
FIG. 4A is a cross-section similar to that of FIG. 3A, after the production of insulating structures, a mask, depressions, conductive structures, further insulating structures, upper source/drain regions, channel regions and lower source/drain regions.
Figure 4B:
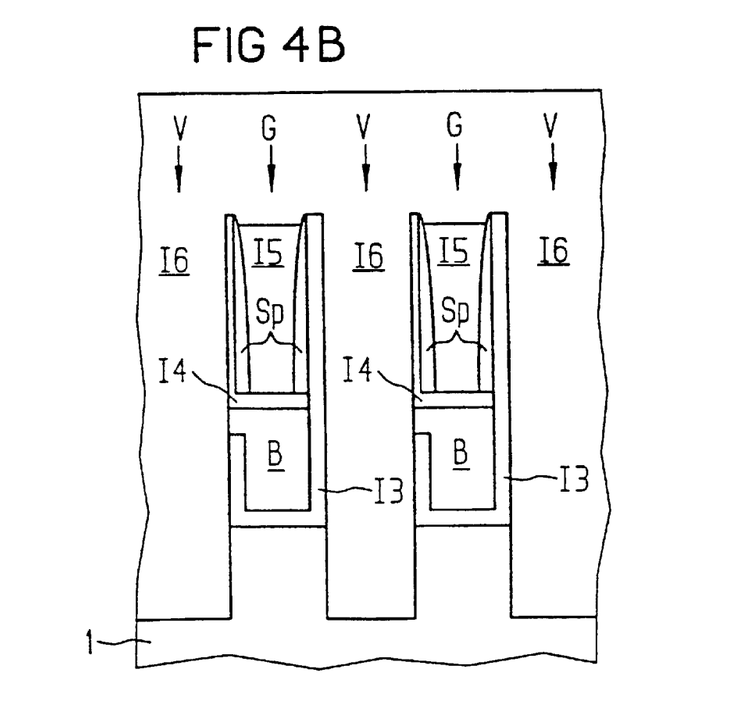
FIG. 4B is the cross-section of FIG. 3B, after the process steps mentioned with reference to FIG. 4A.
Figure 4C:
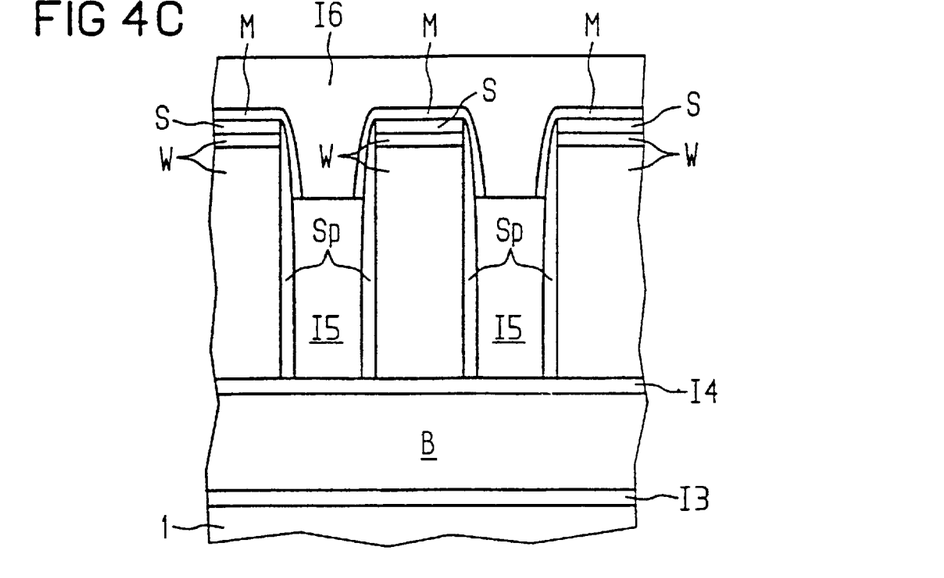
FIG. 4C is the cross-section of FIG. 3C, after the process steps mentioned with reference to FIG. 4A.
Figure 4D:
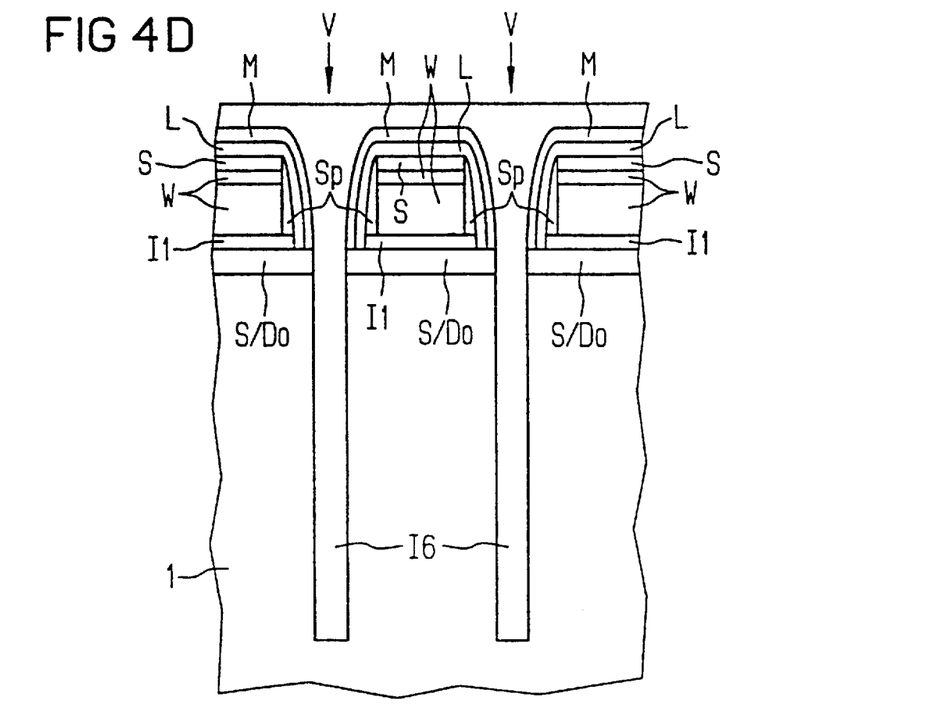
FIG. 4D is the cross-section of FIG. 3D, after the process steps mentioned with reference to FIG. 4A.

Using HBr, for example, the polysilicon and the substrate 1 are etched selectively with respect to the mask M and the insulating structures I5, with the result that depressions V are produced between the word lines W, to be precise between the trenches G (see FIGS. 4B and 4D).

The depressions V have a depth of approximately 450 nm, with the result that they reach more deeply than the cut-outs of the insulation I3.

Through the depressions V, upper source/drain regions S/Do of transistors are produced from the first doped regions D1. Furthermore, conductive structures L connected to the upper source/drain regions S/Do are produced from the polysilicon. On account of the previous etching step with the fourth photoresist mask, the conductive structures L, which are adjacent to one another along the word line W are isolated from one another. Furthermore, through the depressions V, lower source/drain regions S/Du of the transistors are produced from the second doped regions D2 (see FIGS. 4A and 4D). On the first side walls of the trenches, the word lines act as gate electrodes of the transistors and the further insulation acts as a gate dielectric. Parts of the substrate 1, which are arranged between the upper source/drain region S/Do and the lower source/drain region S/Du of each transistor act as channel regions Ka of the transistors.

Afterward, $SiO_2$ is deposited to a thickness of approximately 100 nm and planarized by chemical mechanical polishing. Further insulating structures I6 are thereby produced in the depressions V (see FIGS. 4B and 4D).

Figure 5:
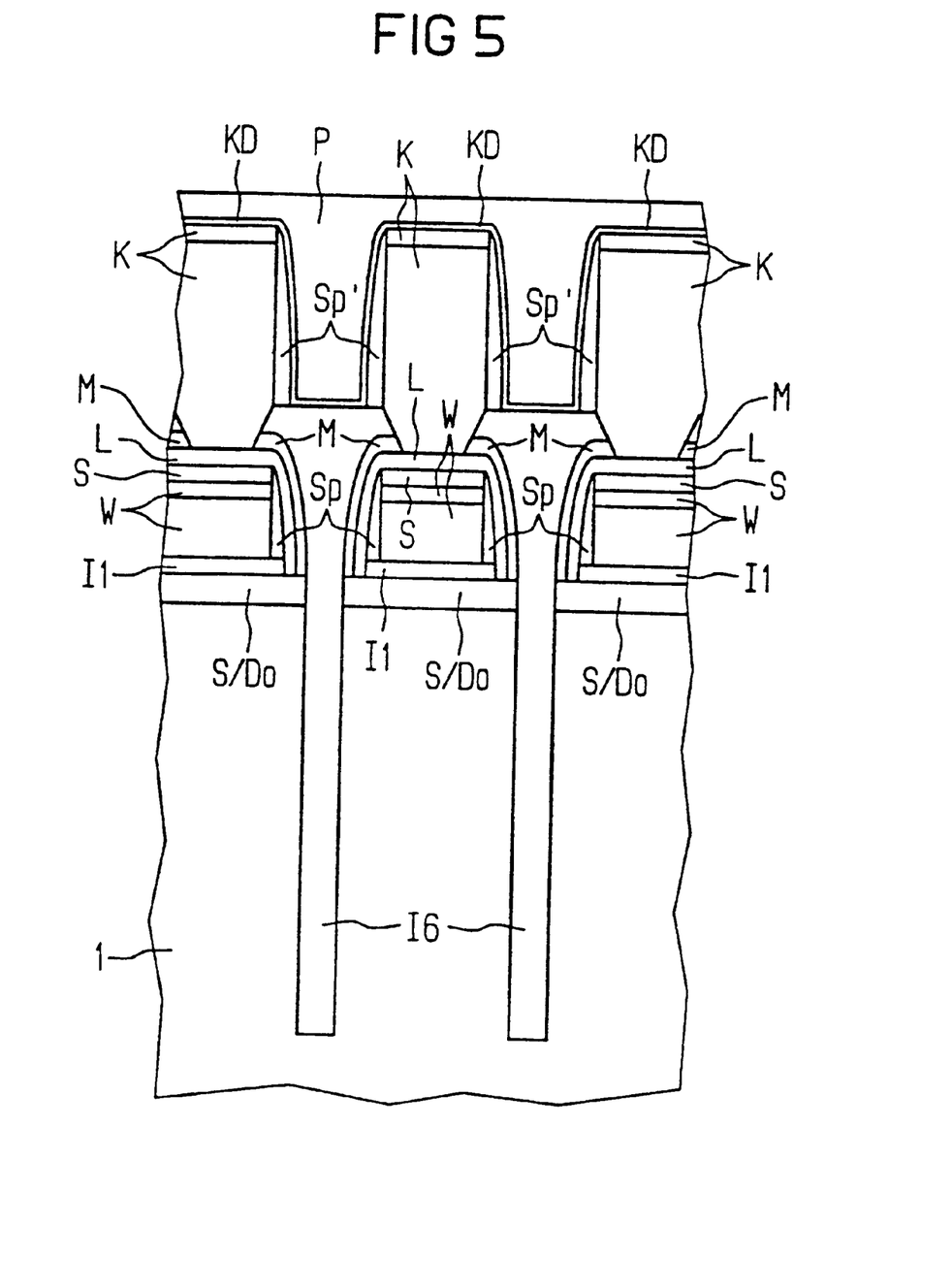
FIG. 5 is a cross-section similar to that of FIG. 4D, after the production of storage nodes, conductive spacers and a capacitor plate.

The conductive structures L are uncovered by means of a photolithographic method (see FIG. 5). Afterward, in-situ-doped polysilicon is deposited to a thickness of approximately 500 nm. Tungsten silicide is deposited above that to a thickness of approximately 100 nm. Storage nodes K of capacitors, which are connected to the conductive structures L, are produced from the tungsten silicide and the polysilicon by means of a photolithographic method (see FIG. 5).

A surface of the storage nodes K is enlarged by conductive spacers Sp', which are produced by depositing tungsten silicide to a thickness of approximately 20 nm and subsequently etching it back. In order to produce a capacitor dielectric KD, silicide nitride is deposited to a thickness of approximately 6 nm and oxidized to a depth of approximately 1 nm. In order to produce a capacitor plate P that is common to the capacitors, titanium nitride is deposited to a thickness of approximately 100 nm (see FIG. 5).

In the exemplary embodiment, a DRAM cell configuration is produced, having memory cells which each comprise one of the transistors and one of the capacitors which is connected thereto.

There are many conceivable variations of the exemplary embodiment, which likewise lie within the scope of the invention. Thus, dimensions of the layers, trenches, structures, depressions and regions can be adapted to the respective requirements. The same applies to the choice of materials.

We claim:

1. A DRAM cell configuration, comprising:
    a plurality of memory cells each having a vertical transistor and a capacitor;
    a substrate formed with substantially parallel trenches each having side walls and having a bit line arranged therein in a lower part thereof;
    an insulation formed in the lower part of a respective said trench between said bit line and said substrate, except for a strip-type cut-out formed parallel to said trench and in said first sidewall of said trench;
    a further insulation formed on parts of said side walls of said trench above the lower part of said trench and an upper area of said bit line;
    word lines extending transversely with respect to said bit line, said word lines, except for downwardly directed protuberances that reach into said trenches and that are arranged above said bit lines, running above said substrate, and an insulating layer isolating said word lines from said substrate;
    said protuberances of said word lines and insulating structures being arranged alternately above said bit line in said trench;
    said transistors having upper source/drain regions and lower source/drain regions arranged between said trenches and under said word lines;
    further insulating structures formed in said substrate for insulating from one another upper source/drain regions of mutually adjacent transistors along said trench; and
    wherein said upper source/drain regions of said transistors are connected to said capacitors of said memory cells.

2. The DRAM cell configuration according to claim 1, wherein said lower source/drain region of said transistor is arranged between said trench and an adjacent trench and is spaced apart from the adjacent trench.

3. The DRAM cell configuration according to claim 1, wherein:
    said upper source/drain region of said transistor of one of said memory cells is covered with said insulating layer;
    said word line runs above said insulating layer;
    a projection of said upper source/drain region onto said insulating layer overlaps a projection of said word line onto said insulating layer such that it is extended beyond two sides of the projection of said word line, with the result that projections of two parts of the upper source/drain region adjoin the projection of said word line and do not overlap the projection of said word line;
    side walls of said word line are provided with insulating spacers;
    an insulating protective layer is formed on an upper surface of said word line remote from said upper source/drain region;
    a conductive structure covers said protective layer and said spacers and overlaps the two parts of said upper source/drain region; and said capacitor of said memory cell is arranged on said conductive structure.

4. The DRAM cell configuration according to claim 1, wherein:
said further insulating structures isolate from one another said lower source/drain regions of mutually adjacent transistors along said trench; and
said lower source/drain regions of said mutually adjacent transistors along said trench and said further insulating structures alternately adjoin said bit line in a region of said cut-out.

5. The DRAM cell configuration according to claim 1, wherein those portions of said further insulations that are covered by said word lines are thickened at edges of said word lines.

6. A method of fabricating a DRAM cell configuration, which comprises the following method steps:
producing an insulating layer on a substrate;
forming substantially parallel trenches in the substrate;
providing an insulation for lower parts of the trenches, except for strip-type cut-outs running parallel to the trenches and arranged on first side walls of the trenches;
producing a bit line in each trench in a lower part thereof;
providing a further insulation for parts of the side walls of the trenches arranged above the lower parts of the trenches and for the bit lines;
filling the trenches with a conductive material;
covering the conductive material with a protective layer;
patterning the conductive material and the protective layer to produce word lines covered by the protective layer and running transversely with respect to the bit lines and having downwardly directed protuberances reaching into the trenches;
depositing insulating material and etching the insulating material back together with the insulating layer selectively with respect to the protective layer and with respect to the substrate, until the substrate is uncovered, such that insulating structures are produced in the trenches, between the protuberances of the word lines and above the bit lines;
etching the substrate selectively with respect to the insulating structures to produce depressions between the word lines and between the trenches;
producing upper source/drain regions of transistors of memory cells between the trenches and between the depressions in the substrate;
producing lower source/drain regions of the transistors each adjoining one of the cut-outs, in the substrate under the upper source/drain regions;
producing further insulating structures in the depressions; and
producing capacitors of the memory cells and connecting each of the capacitors to one of the upper source/drain regions.

7. The method according to claim 6, which comprises:
forming at least a portion of the bit line adjoining the cut-out of doped polysilicon;
carrying out a heat-treating step and thereby diffusing dopant from the bit line into the substrate and forming a doped region, arranged between the trench in which the bit line is arranged and an adjacent trench, adjoining the cut-out, and spaced apart from the adjacent trench.

8. The method according to claim 6, which comprises:
prior to producing the depressions, forming spacers covering side walls of the word lines by depositing and etching back insulating material;
subsequently to producing the insulating structures, depositing conductive material to a thickness that assures that interspaces between the word lines are not filled;
removing portions of the conductive material arranged above the trenches;
producing a mask to cover horizontal surfaces of parts of the conductive material arranged above the word line;
producing the depressions by selectively etching the conductive material and the substrate with respect to the mask, to thereby produce conductive structures adjoining the upper source/drain regions from the conductive material; and
producing the capacitors on the conductive structures.

9. The method according to claim 8, wherein the step of producing the mask comprises:
depositing insulating material non-conformally, such that the insulating material is thickest above horizontal surfaces of the parts of the conductive material arranged above the word line;
etching back the insulating material until parts of the conductive material arranged between the word lines are uncovered.

10. The method according to claim 8, which comprises:
providing conductive material containing doped polysilicon;
subsequently to depositing the conductive material, depositing an auxiliary material and etching back the auxiliary material until lateral areas of the conductive material are uncovered;
thermally oxidizing to thereby produce the mask on uncovered parts of the conductive material; and
removing the auxiliary material.

11. The method according to claim 6, which comprises producing depressions to reach more deeply than the cut-outs of the insulation.

12. The method according to claim 6, which comprises, subsequently to producing the word lines, thermally oxidizing to thicken those parts of the further insulations that are covered by the word lines at edges of the word lines.

* * * * *